(12) United States Patent
Sakaguchi et al.

(10) Patent No.: US 7,169,195 B2
(45) Date of Patent: Jan. 30, 2007

(54) CAPACITOR, CIRCUIT BOARD WITH BUILT-IN CAPACITOR AND METHOD OF MANUFACTURING THE SAME

(75) Inventors: Hideaki Sakaguchi, Nagano (JP); Mitsutoshi Higashi, Nagano (JP); Takashi Mochizuki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/031,764

(22) Filed: Jan. 7, 2005

(65) Prior Publication Data

US 2005/0152097 A1   Jul. 14, 2005

(30) Foreign Application Priority Data

Jan. 9, 2004   (JP) .............................. 2004-004232

(51) Int. Cl.
  *H01G 9/00*   (2006.01)
(52) U.S. Cl. .............................. 29/25.03; 257/E21.479
(58) Field of Classification Search ...................... None
  See application file for complete search history.

(56) References Cited

U.S. PATENT DOCUMENTS 3,631,306 A * 12/1971 Hitchcock .................... 257/30
3,936,545 A * 2/1976 Brill et al. .................... 427/343
5,005,107 A * 4/1991 Kobashi et al. ............. 361/540
6,068,782 A * 5/2000 Brandt et al. ................. 216/17
6,426,866 B1 * 7/2002 Shoji et al. ................. 361/523

FOREIGN PATENT DOCUMENTS

JP       64-32621          2/1989
JP       05283300 A   *   10/1993

* cited by examiner

Primary Examiner—Michael Lebentritt
Assistant Examiner—Cheung Lee
(74) Attorney, Agent, or Firm—Rankin, Hill, Porter & Clark LLP

(57) ABSTRACT

In a capacitor 10, a first electrode 21, a dielectric layer 23, a solid electrolytic layer 50 and a second electrode 31 are provided. In a manufacturing process, the dielectric layer 23 and a first solid electrolytic layer 24 formed by a chemical polymerization film are provided on the first electrode 21 side, while a second solid electrolytic layer 32 formed by an electrolytic polymerization film is provided on the second electrode 31 side. Then, the solid electrolytic layers are bonded to each other.

11 Claims, 4 Drawing Sheets

CAPACITOR, CIRCUIT BOARD WITH BUILT-IN CAPACITOR AND METHOD OF MANUFACTURING THE SAME

This application claims foreign priority based on Japanese Patent application No. 2004-4232, filed on Jan. 9, 2004, the contents of which is incorporated herein by reference in its entirety.

BACKGROUND OF THE INVENTION

1. Field of the Invention

The present invention relates to a capacitor using a solid electrolyte, a circuit board with built-in capacitor, and methods of manufacturing the capacitor and the circuit board with built-in capacitor.

2. Description of the Related Art

A capacitor using a solid electrolyte has a structure in which at least a first electrode, a dielectric layer, a solid electrolytic layer and a second electrode are provided in this order. In conventional way for manufacturing such a capacitor, the dielectric layer is formed on the surface of an anode, which turns out to be the first electrode, by using a method such as an anodic oxidation and the solid electrolytic layer is then formed. Thereafter, a carbon paste or a silver paste is applied onto the surface of the solid electrolytic layer, thereby forming a cathode which turns out to be the second electrode as shown in Japanese Patent Application JP-A-01-32621.

As for the solid electrolytic layer, either an inorganic solid electrolyte such as manganese dioxide, or an organic solid electrolyte such as polypyrrole or a TCNQ complex is used. Otherwise, the inorganic solid electrolyte and the organic solid electrolyte are used together. In any cases, the solid electrolytic layer must be provided on the surface of a dielectric layer.

In a capacitor having such a structure, there is a problem of withstand voltage or leakage current, which is largely influenced by a solid electrolytic layer. Therefore, it is desirable for the capacitor to be formed densely with having more than a certain thickness. In this regard, in the case of forming an inorganic solid electrolyte such as manganese dioxide, the sintering step needs to be repetitively carry out for many times. When the sintering step is repeated, however, a dielectric layer might be damaged through the process. For preventing this problem, the dielectric layer is necessarily formed with relatively thick, however, this causes another problem. That is, in order to form an organic solid electrolytic layer, such as polypyrrole, to be thick and dense, an electrolytic polymerization is suitable to form. However, it is difficult to form the electrolytic polymerization film directly on the surface of the dielectric layer. For this reason, a thin chemical polymerization film is formed on the surface of the dielectric layer to endow a conductivity prior to the electrolytic polymerization film being formed.

In the chemical polymerization film, however, the thickness of the film and the resistance of the film are apt to be varied. In this aspect, it causes further problem in that the property of the electrolytic polymerization film is apt to be varied by the influence of the unevenness. Therefore, in the case in which a capacitor is fabricated in a wiring board to constitute a circuit board with built-in capacitor, if the thickness of the chemical polymerization film has such a large unevenness, it would make unevenness in the thickness of the circuit board with built-in capacitor, which would result in a fatal problem.

SUMMARY OF THE INVENTION

In consideration of the problems described above, it is an object of the invention to provide a method of manufacturing a capacitor which can stably form a solid electrolytic layer having a sufficient thickness without damaging a dielectric layer, a method of manufacturing a circuit board with built-in capacitor, the capacitor, and the circuit board with built-in capacitor.

In order to solve the problems, the invention provides a method of manufacturing a capacitor in which at least a first electrode, a dielectric layer, a solid electrolytic layer and a second electrode are provided, comprising the steps of forming the dielectric layer and a first solid electrolytic layer on a surface of the first electrode in this order, while forming a second solid electrolytic layer on a surface of the second electrode, and bonding a surface of the first solid electrolytic layer, being formed at the first electrode side, with a surface of the second solid electrolytic layer being formed at the second electrode side.

The capacitor manufactured by the manufacturing method according to the invention has such a structure that at least the first electrode, the dielectric layer, the solid electrolytic layer and the second electrode are provided, and the solid electrolytic layer includes the first solid electrolytic layer on the first electrode side and the second solid electrolytic layer on the second electrode side which is bonded to the first solid electrolytic layer.

In the invention, in order to bond the surface of the first electrode at the side on which the first solid electrolytic layer is formed to the surface of the second electrode at the side on which the second solid electrolytic layer is formed, it is preferable that the surface of the first solid electrolytic layer being formed at the first electrode side and the surface of the second solid electrolytic layer being formed at the second electrode side should be bonded to each other through a conductive adhesive agent. By such a structure, it is possible to firmly bond the first solid electrolytic layer to the second solid electrolytic layer irrespective of the property of the solid electrolytic layer.

It is preferable that the conductive adhesive agent should be a paste-like adhesive agent containing a conductive organic material. Such a conductive adhesive agent enters an inside even if concavo-convex portions are provided on the surface of the first solid electrolytic layer or the second solid electrolytic layer. Consequently, it is possible to produce an advantage that the equivalent series resistance of the capacitor can be reduced and the bonding can be carried out firmly.

In the invention, it is preferable that an anodic oxidation should be carried out over a valve metal layer constituting at least the surface layer of the electrode in the formation of the dielectric layer. In this application, the "valve metal" implies a metal capable of forming a dielectric by the anodic oxidation, for example, aluminum, tantalum, niobium, tungsten, vanadium, bismuth, titanium, zirconium, hafnium, their alloy or their compound. In the application, moreover, "a valve metal layer constituting at least the surface layer of the electrode" includes both a configuration in which the electrode is constituted by the valve metal layer and a configuration in which the valve metal layer is provided on the surface of the electrode.

In the invention, it is preferable that both the first solid electrolytic layer and the second solid electrolytic layer should be formed by organic solid electrolytic layers. If they are formed by the organic solid electrolytic layers, it is possible to suppress or prevent the damage of the dielectric layer in a forming process thereof differently from the case in which manganese dioxide is sintered from a manganese nitrate solution.

In the invention, it is preferable that the first solid electrolytic layer should be formed by a chemical polymerization and the second solid electrolytic layer should be formed by an electrolytic polymerization. More specifically, it is preferable that the chemical polymerization should be applied to the formation of the first solid electrolytic layer to be provided on the surface of the dielectric layer and the electrolytic polymerization should be applied to the formation of the second solid electrolytic layer to be directly provided on the electrode.

In the invention, if the dielectric layer is also formed on the surface of the second electrode and the second solid electrolytic layer is then formed on a surface of the dielectric layer, it is possible to manufacture a capacitor of a non-polar type by using the manufacturing method according to the invention.

The capacitor to which the invention is applied can be constituted as a simple electronic component by itself, and furthermore, can be constituted as a capacitor in a circuit board with built-in capacitor which has the capacitor provided in the board. In the latter case, at least one of the first electrode and the second electrode is formed on an insulating base material for constituting the circuit board with built-in capacitor.

In the invention, the dielectric layer and the first solid electrolytic layer are formed on the surface of the first electrode in this order, while the second solid electrolytic layer is formed on the surface of the second electrode and the surface of the first electrode at the side on which the first solid electrolytic layer is formed is bonded to the surface of the second electrode at the side on which the second solid electrolytic layer is formed, thereby constituting the capacitor. Accordingly, the solid electrolytic layer is constituted by the first solid electrolytic layer on the first electrode side and the second solid electrolytic layer on the second electrode side. Therefore, the solid electrolytic layer can be readily formed thickly as compared with the case in which all of the solid electrolytic layers are to be formed on the first electrode. Moreover, each of the first and second solid electrolytic layers to be formed on the first and second electrode sides may be thinned. Consequently, the damage and unevenness of the dielectric layer can be prevented from being generated in the formation of a thick solid electrolyte. Moreover, a thin solid electrolyte can be formed by a method adapted to the properties of the first and second electrodes. Therefore, it is possible to form a dense solid electrolyte. For example, the chemical polymerization can be applied to the formation of the first solid electrolytic layer to be provided on the surface of the dielectric layer and the electrolytic polymerization can be applied to the formation of the second solid electrolytic layer to be directly provided on the electrode. Differently from the conventional art, thus, it is not necessary to form an electrolytic polymerization film on the surface of a chemical polymerization film. Therefore, it is possible to avoid a drawback that the property of the electrolytic polymerization film is varied by the influence of unevenness in the chemical polymerization film.

DESCRIPTION OF THE PREFERRED EMBODIMENTS

Embodiments of the present invention will be described hereinbelow by reference to the drawings. Unless otherwise specifically defined in the specification, terms have their ordinary meaning as would be understood by those of ordinary skill in the art.

[First Embodiment]

The structures of a capacitor and a circuit board with built-in capacitor according to a first embodiment of the invention will be described in detail with an explanation of methods of manufacturing them.

Figure 1:
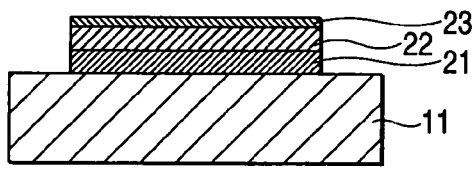
FIG. 1 is a sectional view showing steps in methods of manufacturing a polar capacitor and a circuit board with built-in capacitor according to a first embodiment of the invention.
Figure 1:
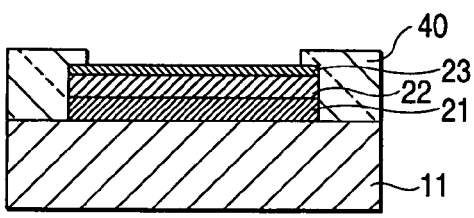
Figure 1:
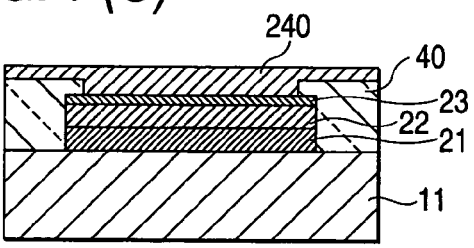
Figure 1:
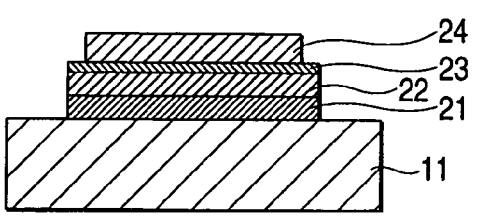
Figure 1:
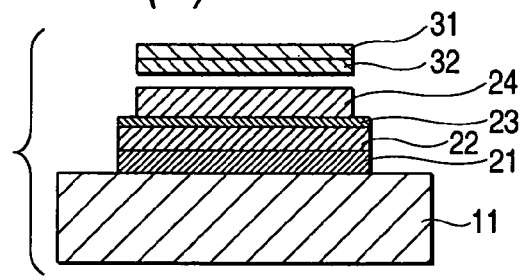
Figure 1:
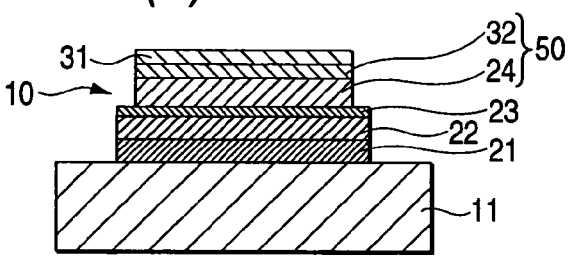
Figure 1:
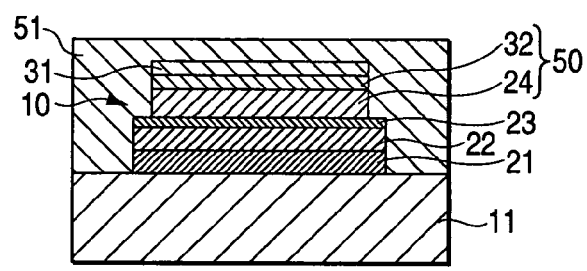
Figure 1:
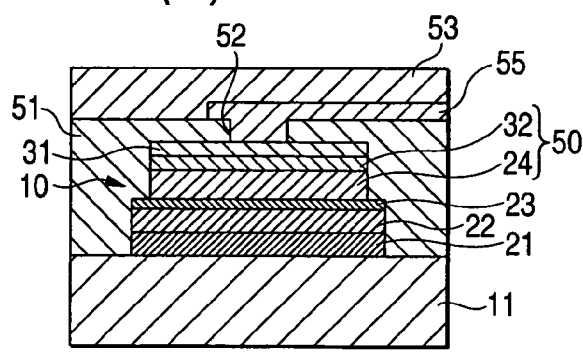

FIG. 1 is a sectional view showing steps in methods of manufacturing a capacitor and a circuit board with built-in capacitor to which the invention is applied. In the method of manufacturing a capacitor according to the embodiment, as shown in FIG. 1(A), a valve metal film 22 such as aluminum, tantalum, niobium, tungsten, vanadium, bismuth, titanium, zirconium, hafnium, their alloy or their compound (for example, niobium doped with oxygen) is formed on the surface of a first electrode 21 formed on a base material 11, and an anodic oxidation is then carried out to form a dielectric film 23 constituted by an anodic oxide film. In the embodiment, a tantalum film or a niobium film doped with oxygen is used as the valve metal film 22.

The base material 11 is an insulating board for forming a circuit board with built-in capacitor which will be described below, for example, and the first electrode 21 is a metal pattern such as copper (Cu) which is formed on the base material 11. In the case in which the first electrode 21 is formed by a valve metal, the anodic oxidation can be carried out over itself to form the dielectric layer 23. Therefore, it is possible to omit the formation of the valve metal film 22 shown in FIG. 1(A). Also in the case in which the dielectric layer 23 is to be formed by utilizing a semiconductor process such as a CVD method or a sputtering method, the formation of the valve metal film 22 shown in FIG. 1(A) can be omitted and the valve metal does not need to be used as the first electrode 21.

As shown in FIG. 1(B), next, it is necessary to selectively form a first solid electrolytic layer 24 constituted by the chemical polymerization film in a predetermined region. As one of the methods for this, it is possible to utilize a lift up method in a semiconductor process. More specifically, a masking material layer 40 opening a region in which the first solid electrolytic layer 24 is to be provided is formed on the surface of the base material 11 by a resist as shown in FIG. 1(B), and a chemical polymerization is carried out in this state to form a chemical polymerization film 240 over the whole surface of the base material 11 as shown in FIG. 1(C), and then, the masking material layer 40 is removed together with the chemical polymerization film 240 formed on the surface of the masking material layer 40. As shown in FIG. 1(D), consequently, it is possible to selectively form the first solid electrolytic layer 24 in a predetermined region.

In this way, as shown in FIG. 1(D), the first solid electrolytic layer 24 is formed on the surface of the dielectric layer 23 at the first electrode 21 side. For the first solid electrolytic layer 24, it is possible to use a chemical polymerization film such as polypyrrole, polyaniline or polythiophene. In order to form such a chemical polymerization film on the surface of the dielectric film 23, for example, a solution containing an oxidizing agent is caused to come in contact with the dielectric layer 23 and the oxidizing agent is fixed onto the surface of the dielectric layer 23, and thereafter, a solution containing a monomer or oligomer such as polypyrrole, polyaniline or polythiophene, and furthermore, a dopant is caused to come in contact with the dielectric layer 23.

Further, as shown in FIG. 1(E), a second solid electrolytic layer 32 is directly formed on the surface of a second electrode 31 such as copper (Cu). In that case, a substrate on which the second solid electrolytic layer 32 is to be formed is the second electrode 31 having a conductivity. Even if a chemical polymerization film is not formed, therefore, an electrolytic polymerization film such as polypyrrole, polyaniline or polythiophene can be directly formed on the surface of the second electrode 31. In order to form such an electrolytic polymerization film on the surface of the second electrode 31, for example, it is preferable to set a stainless plate or a platinum plate to be a counter electrode, thereby carrying out the electrolytic polymerization in a solution containing a monomer or oligomer such as polypyrrole, polyaniline or polythiophene, and furthermore, a dopant. The second electrode 31 may be used in the state of a metal foil such as a copper foil or may have such a structure that the copper layer to be the second electrode 31 is formed on a base material such as a resin film (which is not shown).

As shown in FIG. 1(F), subsequently, the surface of the first solid electrolytic layer 24 formed on the first electrode 21 at and the surface of the second solid electrolytic layer 32 formed on the second electrode 31 are bonded to each other by a method such as hot press.

Thus, a capacitor 10 is manufactured in which the first electrode 21, the dielectric layer 23, a solid electrolytic layer 50 and the second electrode 31 are provided.

Figure 4:
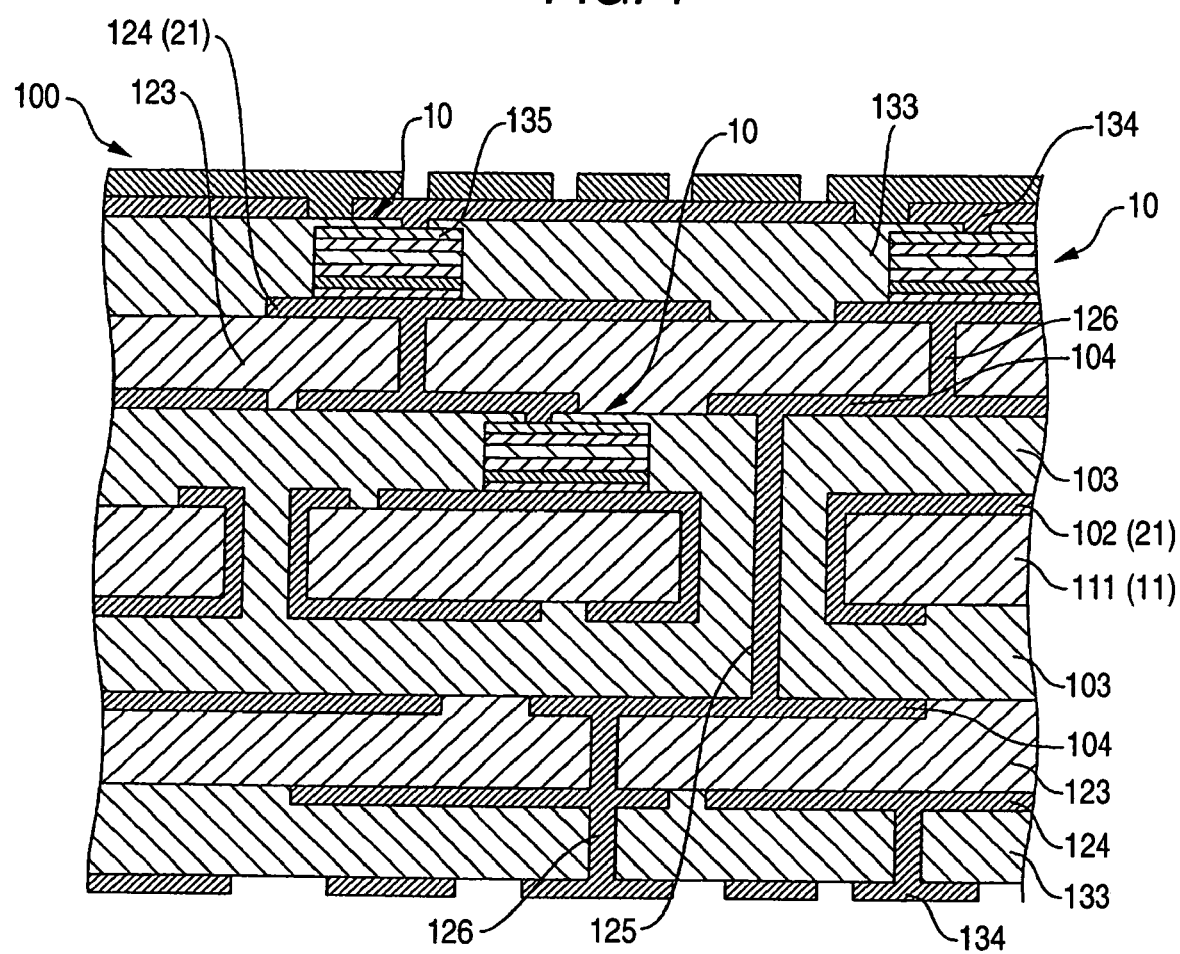
FIG. 4 is a sectional view showing a circuit board with built-in capacitor in which the capacitor applying the invention is provided.

In the case in which a circuit board with built-in capacitor which will be described below with reference to FIG. 4 is to be manufactured, next, a step of embedding the capacitor 10 in a wiring board is carried out. For this purpose, first of all, an epoxy resin is applied onto the whole surface of the base material 11 and is then caked to form an insulating layer 51 as shown in FIG. 1(G), and subsequently, a contact hole 52 to reach the second electrode 31 is formed on the insulating layer 51 by a method such as laser beam machining as shown in FIG. 1(H). Then, a metal layer formed by a Cu film is formed on the surface of the insulating layer 51 by a sputtering method, and thereafter, the metal layer is subjected to patterning by a photolithographic technique to form a wiring layer 55. Subsequently, the epoxy resin is applied onto the surface of the wiring layer 55 and is then caked to form an insulating layer 53.

Thus, there are manufactured the capacitor 10 in which the first electrode 21, the valve metal layer 22, the dielectric layer 23, the solid electrolytic layer 50 and the second electrode 31 are provided on the base material 11, and a wiring board having the capacitor 10 provided therein (a circuit board with built-in capacitor). In the methods of manufacturing the capacitor 10 and the circuit board with built-in capacitor, in the embodiment, the first solid electrolytic layer 24 formed on the first electrode 21 side and the second solid electrolytic layer 32 formed on the second electrode 31 side are provided to constitute the solid electrolytic layer 50, where the first solid electrolytic layer 24 and the second solid electrolytic layer 32 are bonded to each other. As compared with the case of a single solid electrolytic layer being formed on the first electrode in conventional way, the solid electrolytic layer 50 in this invention can be readily formed with thick. Moreover, each of the first solid electrolytic layer 24 and the second solid electrolytic layer 32 which are respectively formed on the first electrode 21 side and the second electrode 31 side can be made thin. Therefore, the damage or unevenness of the dielectric layer 23 might be thus prevented in the formation of the thick solid electrolytic layer 50.

Moreover, a thin solid electrolytic layer can be formed by a method adapted to the properties of the first electrode 21 and the second electrode 31. More specifically, a chemical polymerization can be applied to the formation of the first solid electrolytic layer 24 to be provided on the surface of the dielectric layer 23 and an electrolytic polymerization can be applied to the formation of the second solid electrolytic layer 32 to be directly provided on the second electrode 31. Differently from the conventional art, thus, it is not necessary to provide an electrolytic polymerization film on the surface of a chemical polymerization film, thereby forming a solid electrolytic layer. Therefore, it is possible to avoid a drawback that the property of the electrolytic polymerization film (the second solid electrolytic layer 32) is varied by the influence of unevenness in the chemical polymerization film (the first solid electrolytic layer 24).

[Second Embodiment]

Figure 2:
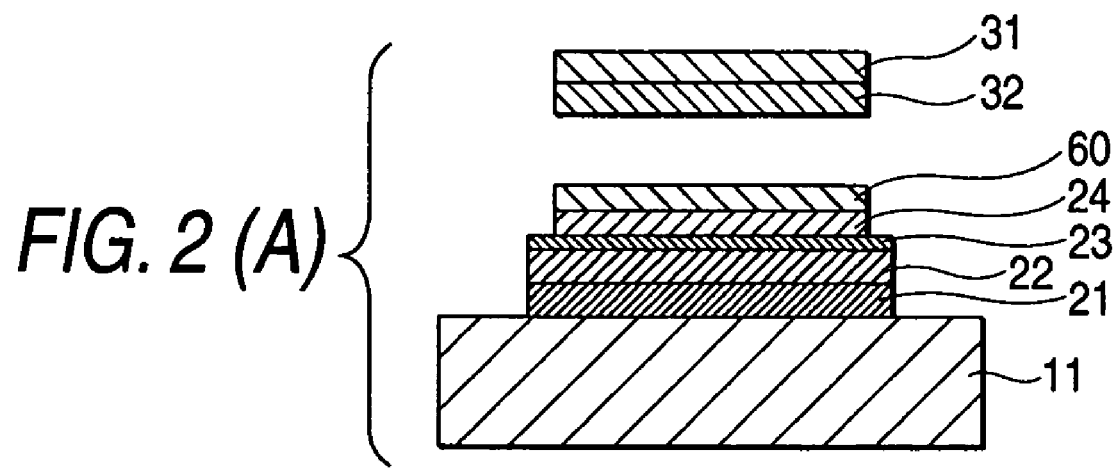
FIG. 2 is a sectional view showing steps in another method of manufacturing a capacitor according to a second embodiment of the invention.
Figure 2:
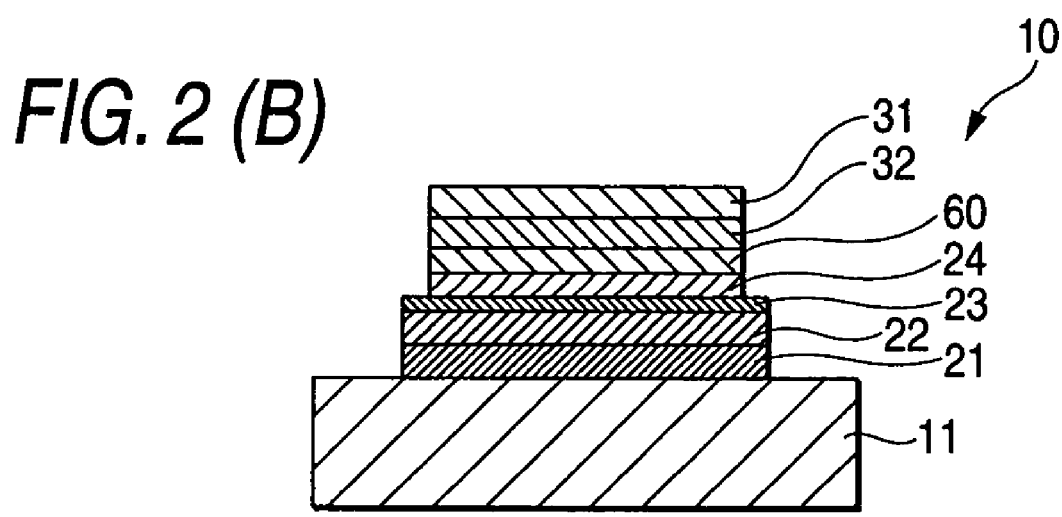

FIG. 2 is a sectional view showing steps in a method of manufacturing a capacitor according to a second embodiment of the invention.

In the embodiment, as shown in FIG. 2(A), a conductive adhesive agent 60 is provided between the surface of a first solid electrolytic layer 24 formed on a first electrode 21 and the surface of a second solid electrolytic layer 32 formed on a second electrode 31, where a heat press is carried out in this state so that bonding the first solid electrolytic layer 24 to the second solid electrolytic layer 32 can be made. By such a structure, the first solid electrolytic layer 24 and the second solid electrolytic layer 32 can be bonded firmly irrespective of the property of the solid electrolytic layer.

It is preferable that the conductive adhesive agent 60 should be a paste-like adhesive agent containing, as a conductive organic material, a conductive polymer such as polypyrrole or an organic semiconductor such as a TCNQ complex. Such a conductive adhesive agent 60 enters an inside even if concavo-convex portions are provided on the surface of the first solid electrolytic layer 24 or the second solid electrolytic layer 32. Consequently, it is possible to produce an advantage that the equivalent series resistance of the capacitor 10 can be reduced and the bonding can be also carried out firmly.

[Third Embodiment]

Figure 3:
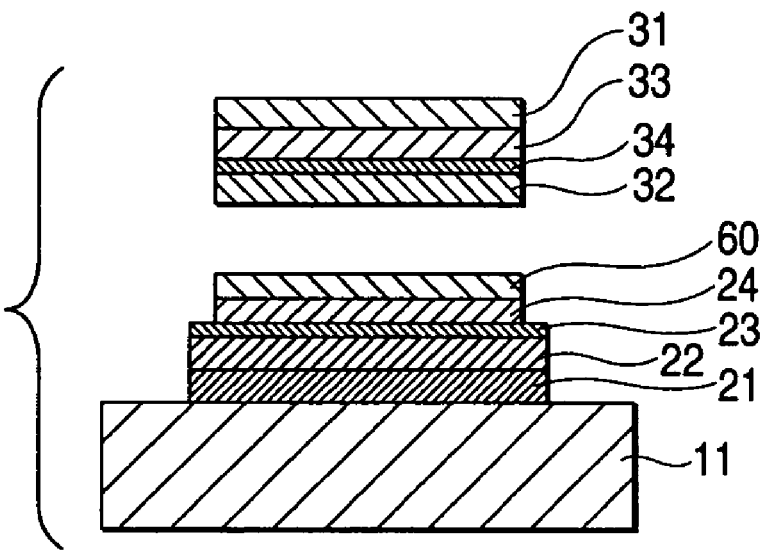
FIG. 3 is a sectional view showing steps in a method of manufacturing a non-polar capacitor according to a third embodiment of the invention.
Figure 3:
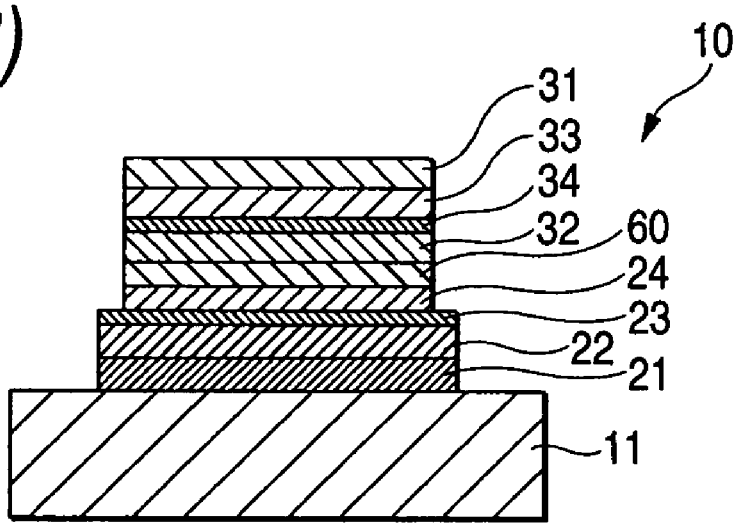

FIG. 3 is a sectional view showing steps in a method of manufacturing a capacitor according to a third embodiment of the invention.

While the polar capacitor has been manufactured in the first and second embodiments, it is also possible to manufacture a non-polar (non-polar type) capacitor 10 by forming a valve metal film 33 on the surface of a second electrode 31 and then carrying out an anodic oxidation to form a dielectric layer 34 constituted by an anodic oxide film, and thereafter, forming a second solid electrolytic layer 32 on the surface of the dielectric layer 34 as shown in FIG. 3(A), and subsequently, bonding the surface of a first solid electrolytic layer 24, which is formed on a first electrode 21, to the surface of the second solid electrolytic layer 32, which is formed on the second electrode 31, with a paste-like conductive adhesive agent 60 interposed in-between. As a conductive organic material, a conductive polymer such as polypyrrole or an organic semiconductor such as a TCNQ complex might be preferably used. It is noted that the bonding might be also performed directly without help of such adhesive agents.

In this case, referring to the first solid electrolytic layer 24 and the second solid electrolytic layer 32, it is possible to use a solid electrolytic layer constituted by a chemical polymerization film or a solid electrolytic layer having an electrolytic polymerization film formed on the surface of the chemical polymerization film.

As for other Embodiments, while the conductive polymer such as polypyrrole, polyaniline or polythiophene has been used for the first solid electrolytic layer 24 and the second solid electrolytic layer 32 in the embodiments, a TCNQ complex may be used as the first solid electrolytic layer 24 and the second solid electrolytic layer 32. In case of the TCNQ complex, for example, it is preferable that heating and melting should be carried out in a state in which the TCNQ complex is disposed on a predetermined region, and cooling and caking should be then performed to form a solid electrolytic layer. Moreover, the invention may be applied to a capacitor using, for a solid electrolyte, manganese dioxide obtained by sintering a manganese nitrate solution in place of such an organic solid electrolyte or together with the organic solid electrolyte.

FIG. 4 is a sectional view showing a circuit board with built-in capacitor in which a capacitor applying the invention is provided in a wiring board. In FIG. 4, a board 100 having an internal capacitor according to the embodiment is a circuit board having a so-called built-up structure. In the board 100 having an internal capacitor, the upper and lower surfaces of a core substrate 111 formed by a silicon substrate, a ceramic substrate, a resin substrate or a glass-epoxy substrate are provided with a plurality of wiring layers 102, 104, 124 and 134 formed by copper layers. These wiring layers are isolated from each other through insulating films 103, 123 and 133. In the embodiment, a part of the wiring layers 102 and 124 is utilized as the first electrode of the capacitor 10.

In the board 100 having an internal capacitor, three capacitors 10 are provided in total at the upper surface side of the core substrate 111, and all of these capacitors 10 are shown to be manufactured by the method according to the second embodiment, for example. More specifically, in all of the three capacitors 10, the wiring layers 102 and 124 to be the first electrode 21, the valve metal film 22, the dielectric layer 23, the solid electrolytic layer 50 and the second electrode 31 are provided, and the solid electrolytic layer 50 includes the first solid electrolytic layer 24 on the first electrode 21 side and the second solid electrolytic layer 32 on the second electrode 31 side which is bonded to the first solid electrolytic layer 24 through the conductive adhesive agent 60 as shown in FIG. 2(B). Moreover, the capacitor 10 and the wiring layers 102, 104, 124 and 134 are mutually connected through a through hole 125 formed on the core substrate 111 and the insulating films 103, 123 and 133 by a method such as laser beam machining and a conductive metal filled in a via 126.

In the invention, the solid electrolytic layer is constituted by the first solid electrolytic layer on the first electrode side and the second solid electrolytic layer on the second electrode side. Therefore, the solid electrolytic layer can be readily formed thickly as compared with the case in which a single solid electrolytic layer is to be formed on the first electrode. Moreover, each of the first and second solid electrolytic layers to be respectively formed on the first and second electrode sides may be thinned. Consequently, the damage and unevenness of the dielectric layer can be prevented in the formation of a thick solid electrolyte. Moreover, a thin solid electrolyte can be formed by a method adapted to the properties of the first and second electrodes. Therefore, it is possible to form a dense solid electrolyte. For example, a chemical polymerization can be applied to the formation of the first solid electrolytic layer to be formed on the surface of the dielectric layer and an electrolytic polymerization can be applied to the formation of the second solid electrolytic layer to be directly provided on the electrode. Accordingly, it is not necessary to form an electrolytic polymerization film on the surface of a chemical polymerization film. Therefore, it is possible to avoid a drawback that the property of the electrolytic polymerization film is varied by the influence of unevenness in the chemical polymerization film.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of manufacturing a capacitor in which at least a first electrode, a dielectric layer, a solid electrolytic layer and a second electrode are provided, comprising the steps of:
    forming the dielectric layer and a first solid electrolytic layer on a surface of the first electrode, while forming a second solid electrolytic layer on a surface of the second electrode;
    placing a conductive adhesive agent between said first solid electrolytic layer and said second solid electrolytic layer; and
    bonding a surface of the first solid electrolytic layer being formed at the first electrode side with a surface of the second solid electrolytic layer being formed at the second electrode side via said conductive adhesive agent.

2. The method of manufacturing a capacitor according to claim 1, wherein the conductive adhesive agent is a paste-like adhesive agent containing a conductive organic material.

3. The method of manufacturing a capacitor according to claim 1, wherein a valve metal layer constitutes at least a surface layer of the first electrode, and wherein the dielectric layer is formed by anodic oxidation of the valve metal layer.

4. The method of manufacturing a capacitor according to claim 1, wherein the first solid electrolytic layer is formed by a chemical polymerization and the second solid electrolytic layer is formed by an electrolytic polymerization.

5. A method of manufacturing a circuit board with built-in capacitor using the manufacturing method according to claim 1, wherein at least one of the first electrode and the second electrode is formed on an insulating base material for constituting the circuit board with built-in capacitor.

6. A method of manufacturing a capacitor in which at least a first electrode, a first dielectric layer, a second dielectric layer, a solid electrolytic layer and a second electrode are provided, comprising the steps of:

forming the first dielectric layer on a surface of the first electrode;

forming a first solid electrolytic layer on a surface of the first dielectric layer;

forming the second dielectric layer on a surface of the second electrode;

forming a second solid electrolytic layer on a surface of the second dielectric layer; and bonding a surface of the first solid electrolytic layer being formed at the first electrode side with a surface of the second solid electrolytic layer being formed at the second electrode side, wherein said bonding step includes:

interposing a conductive adhesive agent between the first and second solid electrolytic layers; and, pressing the first and second solid electrolytic layers together.

7. The method of manufacturing a capacitor according to claim 6, wherein the conductive adhesive agent is a paste-like adhesive agent containing a conductive organic material.

8. The method of manufacturing a capacitor according to claim 6, wherein a valve metal layer constitutes at least a surface layer of the first electrode, and wherein the first dielectric layer is formed by anodic oxidation of the valve metal layer.

9. The method of manufacturing a capacitor according to claim 6, wherein the first solid electrolytic layer is formed by a chemical polymerization and the second solid electrolytic layer is formed by an electrolytic polymerization.

10. A method of manufacturing a capacitor, comprising the steps of:

providing a first electrode having a first face and an oppositely directed second face, said first and second faces being generally planar;

forming a dielectric layer on the first face of the first electrode, said dielectric layer having a surface facing away from the first electrode;

forming a first solid electrolytic layer on the surface of the dielectric layer by chemical polymerization, said first solid electrolytic layer having a surface facing away from the dielectric layer;

providing a second electrode having a first face and an oppositely directed second face, said first and second faces of the second electrode being generally planar;

forming a second solid electrolytic layer on the first face of the second electrode by electrolytic polymerization, said second solid electrolytic layer having a surface facing away from the second electrode; and, interposing a conductive adhesive agent between the surface of the first solid electrolytic layer and the surface of the second solid electrolytic layer;

pressing the first solid electrolytic layer and the second solid electrolytic layer together so as to bond the surface of the first solid electrolytic layer to the surface of the second solid electrolytic layer via said conductive adhesive agent.

11. The method according to claim 10, wherein the first electrode includes a valve metal layer, and wherein the first face of the first electrode is provided by the valve metal layer such that the dielectric layer is formed on the valve metal layer.

* * * * *